United States Patent
Song et al.

(10) Patent No.: US 8,405,943 B2
(45) Date of Patent: Mar. 26, 2013

(54) CIRCUIT AND METHOD FOR POWER CLAMP TRIGGERED DUAL SCR ESD PROTECTION

(75) Inventors: Ming-Hsiang Song, Hsin-Chu (TW); Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/282,179

(22) Filed: Oct. 26, 2011

(65) Prior Publication Data
US 2012/0037956 A1    Feb. 16, 2012

Related U.S. Application Data

(62) Division of application No. 12/258,946, filed on Oct. 27, 2008, now Pat. No. 8,049,250.

(51) Int. Cl.
*H02H 3/22* (2006.01)
(52) U.S. Cl. .......................................... 361/56; 361/111
(58) Field of Classification Search ............... 361/56, 361/111
See application file for complete search history.

(56) References Cited

U.S. PATENT DOCUMENTS

| | | | |
|---|---|---|---|
| 2002/0041007 A1* | 4/2002 | Russ | 257/546 |
| 2002/0122280 A1 | 9/2002 | Ker et al. | |
| 2003/0076636 A1 | 4/2003 | Ker et al. | |
| 2004/0027744 A1 | 2/2004 | Liu et al. | |
| 2004/0100745 A1* | 5/2004 | Chen et al. | 361/56 |
| 2005/0270710 A1 | 12/2005 | Ker et al. | |
| 2007/0018193 A1 | 1/2007 | Ker et al. | |
| 2008/0217650 A1 | 9/2008 | Morishita | |
| 2008/0278872 A1 | 11/2008 | Wang et al. | |
| 2009/0179222 A1 | 7/2009 | Ker et al. | |
| 2009/0268359 A1 | 10/2009 | Chatty et al. | |
| 2010/0140659 A1* | 6/2010 | Ker et al. | 257/173 |

FOREIGN PATENT DOCUMENTS
CN 101039027 A 9/2007

OTHER PUBLICATIONS

Ker, M-D., et al., "Native-NMOS-Triggered SCR (NANSCR) for ESD Protection in 0.13-μm CMOS Integrated Circuits," 42$^{nd}$ Annual International Reliabillity Physics Symposium, Phoenix, 2004 IEEE, pp. 381-386.

(Continued)

*Primary Examiner* — Danny Nguyen
(74) *Attorney, Agent, or Firm* — Slater & Matsil, L.L.P.

(57) ABSTRACT

Circuit and method for RC power clamp triggered dual SCR ESD protection. In an integrated circuit, a protected pad is coupled to an upper SCR circuit and a lower SCR circuit; and both are coupled to the RC power clamp circuit, which is coupled between the positive voltage supply and the ground voltage supply. A structure for ESD protection is disclosed having a first well of a first conductivity type adjacent to a second well of a second conductivity type, the boundary forming a p-n junction, and a pad contact diffusion region in each well electrically coupled to a pad terminal; additional diffusions are provided proximate to and electrically isolated from the pad contact diffusion regions, the diffusion regions and first and second wells form two SCR devices. These SCR devices are triggered, during an ESD event, by current injected into the respective wells by an RC power clamp circuit.

19 Claims, 7 Drawing Sheets

| ESD Mode | Main Path | Supporting Path |
|---|---|---|
| PS | SCR_D | Dio_U + bigFET |
| PD | Dio_U | SCR_D + Dio_CL |
| NS | Dio_D | Dio_CL + SCR_U |
| ND | SCR_U | bigFET + Dio_D |

OTHER PUBLICATIONS

Ker, M., et al.; "Substrate-Triggered SCR Device for On-Chip ESD Protection in Fully Sillicided Sub-0.25-um CMOS Process", IEEE Trans. Electron. Devices, vol. 50, No. 2, Feb. 2003, pp. 397-405.

Mergens, M.P.M, et al., "Diode-Triggered SCR (DTSCR) for RF-ESD Protection of BiCMOS SiGe HBTs and CMOS Ultra-Thin Gate Oxides," Electronic Devices Meeting, Dec. 8-10, 2003, IEDM '03 Technical Digest, IEEE, pp. 21.3.1-21.3.4.

Morishita, Y., "A PNP-Triggered SCR with Improved Trigger Techniques for High-Speed I/O ESD Protection in Deep Sub-Micron CMOS LSIs," $27^{th}$ Electrical Overstress/Electrostatic Discharge Symposium, 2005, pp. 1-7.

Morishita, Y., et al., "A Low-Leakage SCR Design Using Trigger-PMOS Modulations for ESD Protection," $29^{th}$ Electrical Overstress/Electrostatic Discharge Symposium 2007, pp. 7A.1.1-7A.1-9.

* cited by examiner

Fig.1 (Prior Art)

| ESD Mode | Main Path | Supporting Path |
|---|---|---|
| PS | Dio_U + bigFET | --- |
| PD | Dio_U | --- |
| NS | Dio_D | --- |
| ND | bigFET + Dio_D | --- |

| ESD Mode | Main Path | Supporting Path |
|---|---|---|
| PS | SCR_D | Dio_U + bigFET |
| PD | Dio_U | SCR_D + Dio_CL |
| NS | Dio_D | Dio_CL + SCR_U |
| ND | SCR_U | bigFET + Dio_D |

CIRCUIT AND METHOD FOR POWER CLAMP TRIGGERED DUAL SCR ESD PROTECTION

This application is a divisional of U.S. patent application Ser. No. 12/258,946, entitled "Circuit and Method for Power Clamp Triggered Dual SCR ESD Protection," filed on Oct. 27, 2008, which application is incorporated herein by reference.

BACKGROUND

The present application relates to a circuit for providing improved electro-static discharge (ESD) protection for use in semiconductor devices and integrated circuits. ESD protection is presently provided to protect the internal circuitry of semiconductor devices in the presence of an electro-static stress event, such as a static discharge that occurs from a human body or machine approaching an electrically isolated device or circuit board. These ESD stress events may cause voltages in excess of the kilovolts range to be coupled to a pin of an integrated circuit. Without the ESD protection, the internal devices can be damaged or destroyed. The present application is directed to providing an improved ESD circuit and methods that effectively provide efficient and effective ESD protection.

In integrated circuits, ESD stress events must be protected against. ESD events occur when a charged object, such as a human body or another machine, is placed in proximity to an integrated circuit device and a static discharge occurs. The conductive leads on a packaged IC make an efficient surface for receiving electro-static discharge. If the voltage stress that is caused by the discharge into an integrated circuit pin is not protected against, physical damage including breakdown, metal electromigration, gate oxide rupture and other damage due to an ESD event stress may destroy or damage the physical devices within the integrated circuit.

Prior art ESD protection approaches involve a variety of circuit elements that are placed in proximity to the pads of the integrated circuit. Typically, a bond wire couples the input/output pad, which is a metallic or conductive surface, to a package pin. The pins may be gold, Alloy 42, copper, palladium and nickel plated material or the like. The ESD protection circuit provides a path to a safe terminal, typically a power supply pin or ground pin, and causes the electro-static current (called a "strike") to bypass the susceptible semiconductor devices formed within the integrated circuit. An effective ESD circuit can protect a device and prolong its life.

The level of ESD protection needed for integrated circuits varies widely depending on the application and the type of integrated circuits. Circuits intended for use in automobile applications require particularly robust ESD protection. Similarly, integrated circuits that are intended to be handled by a consumer, such as flash cards and DIMM modules that a consumer physically inserts into a board or slot are particularly vulnerable to human body ESD strikes. In contrast, circuits that are installed into a robust circuit board inside a factory setting and placed on a well protected system in a highly controlled environment may require far less robust ESD protection. The work stations, workers, and the tools used in such an environment can be strapped to a ground terminal, and the humidity and materials used in the environment can be controlled to lower the probability of a static discharge event. In some cases, this protection may lower the ESD probability to a level such that on-board protection circuitry may not be required. This is a rare case, however, and most integrated circuits have some on-board ESD circuitry.

The electronics industry has created standards and classes for ESD ratings of devices, so that the purchasers of an integrated circuit may know what level of protection or class of ESD event the integrated circuit is designed for. These may be described as classes of protection for a human body model (HBM) event, for example. Class 0 may be for events from 0-2 kilovolts, Class 1 may be from 2 kilovolts to 4 kilovolts, Class 2 may be for greater than 4 kilovolts. Machine model (MM) events are also specified. This information is typically provided by an IC manufacturer so that the buyer understands what ESD stresses the device can withstand.

ESD events typically happen between an input, input/output or output pad and another terminal, either Vss (ground) and Vdd (positive power supply). Four modes of ESD stress are commonly described. A positive voltage from a pad to Vss may be referred to as a PS strike, a positive voltage from a pad to Vdd may be referred to as a PD strike, a negative voltage from a pad to Vss may be referred to as an NS strike, and a negative voltage from a pad to Vdd may be referred to as a ND strike. These descriptions will be used throughout this specification.

An effective ESD protection scheme must provide protective paths for each of these four modes of ESD stress. In addition, a path is often provided between the power supply pads; that is, from Vss to Vdd, and from Vdd to Vss. In the prior art, ESD protection circuits are provided at each protected pad. The pads are a conductive area formed on a surface of the integrated circuit for receiving an external connection, typically a bond wire or ball grid array (BGA) ball. The pads are then coupled by electrical conductors to internal circuitry. An input/output pad has an input path coupled to a driver circuit, usually a CMOS inverter, for receiving input voltage signals, and to an output path coupled to an internal buffer or inverter for driving an output; the circuit is arranged so that at a given time the PAD signal is either being received as an input signal or being driven at an output signal. An ESD protection circuit is placed at each of these many pads and thus prevents an ESD strike event from damaging the internal circuitry.

Prior art ESD protection circuits can take several forms but typically require, in addition to a path for the ESD current that bypasses the internal circuitry, a trigger circuit for each one protection circuit. Thus, prior art ESD protection circuits use a substantial amount of silicon area, and therefore reduce the available area for the application circuits in the integrated circuit. In addition, some prior art ESD circuits do not provide efficient paths for the ESD current to flow in all of the known modes, and therefore the ESD protection obtained is not as robust as is desired.

Figure 1:
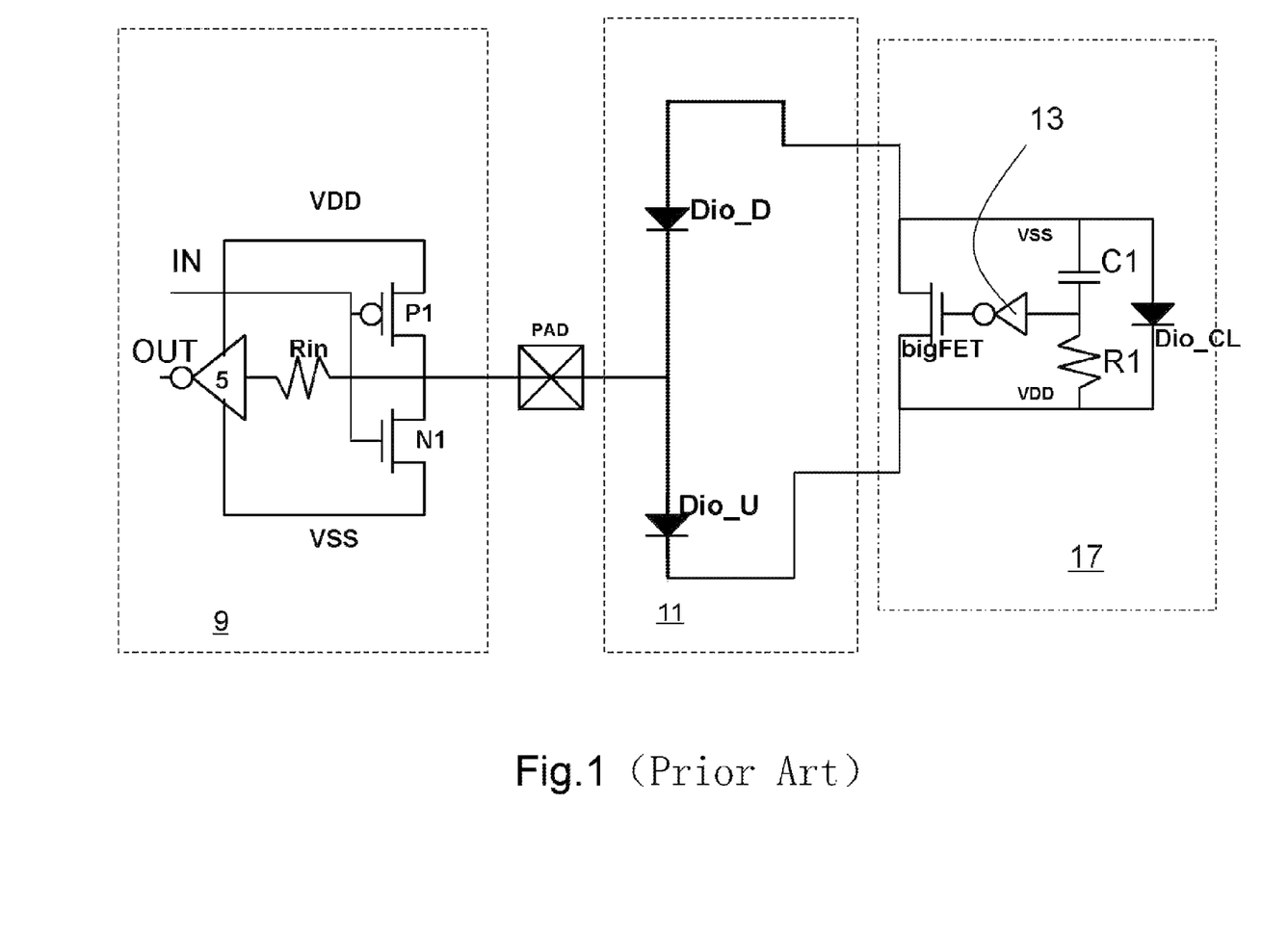
FIG. 1 illustrates in a simplified circuit diagram a prior art ESD circuit.

FIG. 1 illustrates a simplified system diagram of a known prior art circuit with ESD protection. In FIG. 1, a pad labeled PAD is coupled to an input/output buffer circuit 9. Circuit 9 includes an input buffer 5 for supplying incoming data to the remaining circuitry, an output signal OUT coupled to a CMOS inverter of PMOS transistor P1 and NMOS transistor N1, the input impedance Rin (which may be the parasitic or inherent impedance of the transistors that form buffer 5); and a signal coupled to PAD. An ESD protection circuit 11 is shown coupled to the PAD terminal. ESD protection circuit 11 is comprised of a first diode Dio_U, coupled between the PAD and the positive voltage supply VDD. A positive voltage ESD strike on the PAD will forward bias the diode Dio_U and a path will exist for ESD current to flow to the power supply terminal, bypassing the susceptible devices in the circuit 9, which is sometimes called the "victim" circuit. Diode Dio_D is coupled between the negative supply or ground VSS and the PAD. A negative voltage ESD strike at the PAD will forward bias Dio_D and current will flow from VSS to the PAD terminal, bypassing the circuitry in victim circuit 9. A circuit 17 is also shown. This circuit is referred to as a "power clamp" and provides ESD protection between the power supply terminals VSS and VDD. Inverter 13 will turn on a large FET transistor labeled "bigFET" during a positive event from VDD to VSS, providing a path for current to flow and protecting victim circuit 9. The values for R1 and C1 are chosen to cause the bigFET transistor to turn on for an appropriate event, but also chosen to try and keep it from turning on during normal switching operations. Diode Dio_CL provides a path from VSS to VDD for a negative voltage ESD strike between the power supplies. In a prior art integrated circuit, every pad will require ESD protection circuit 11, and there may be hundreds of signal pads to a large integrated circuit. However, the power clamp circuit 17 is not required at each pad and may be formed in one location on the integrated circuit, or alternatively several could be provided.

Figure 2:
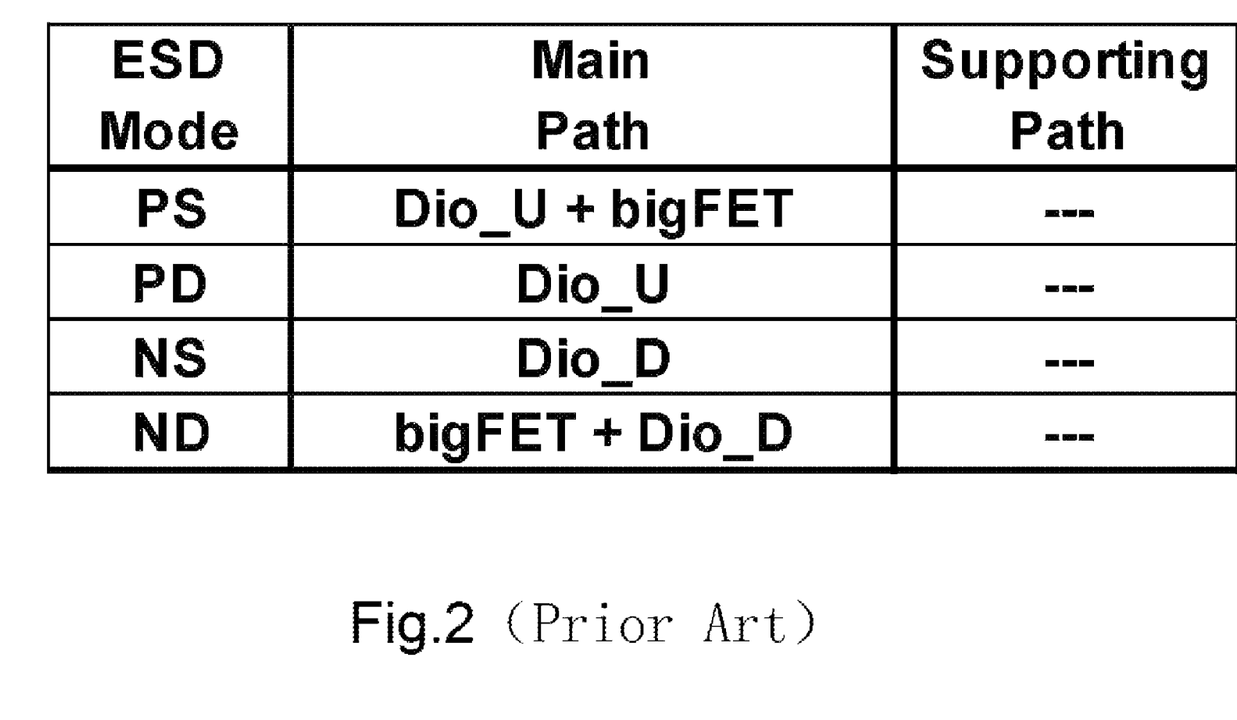
FIG. 2 illustrates a table of operations for the circuit of FIG. 1.

FIG. 2 illustrates the operations of the ESD protection circuits of FIG. 1 for the four modes of ESD strike described above. For a PS strike, positive from the PAD to VSS, the path for current is through two devices; Dio_U turns on and current flows to VDD, and then the bigFET transistor in the power clamp turns on and provides the path to VSS. This is not a direct path and so provides less than desirable results, a direct path through one device would be safer and faster; and is therefore more robust. For a PD strike, positive from the PAD to the supply VDD, the diode Dio_U is forward biased and provides a direct path. Similarly, for a negative strike at PAD with respect to VSS, the diode Dio_D is forward biased and provides a direct current path. Finally, for a negative strike ND from PAD to VDD, an indirect path through the bigFET transistor and then through diode Dio_D exists. Again, this indirect path is not preferred as the current must flow through two devices to reach the terminal, and this is less robust than a direct path and therefore provides less protection than desired.

Many ESD circuits rely on a silicon controlled rectifier (SCR) device to provide a current path. SCR devices are known in the art to be formed from p-n-p-n or n-p-n-p junctions. Once an SCR device is triggered, it will continue to conduct current so long as an adequate hold current is present, and the low on-resistance Ron for the SCR device and low triggering voltage makes them particularly useful in ESD protection circuits.

Figure 3:
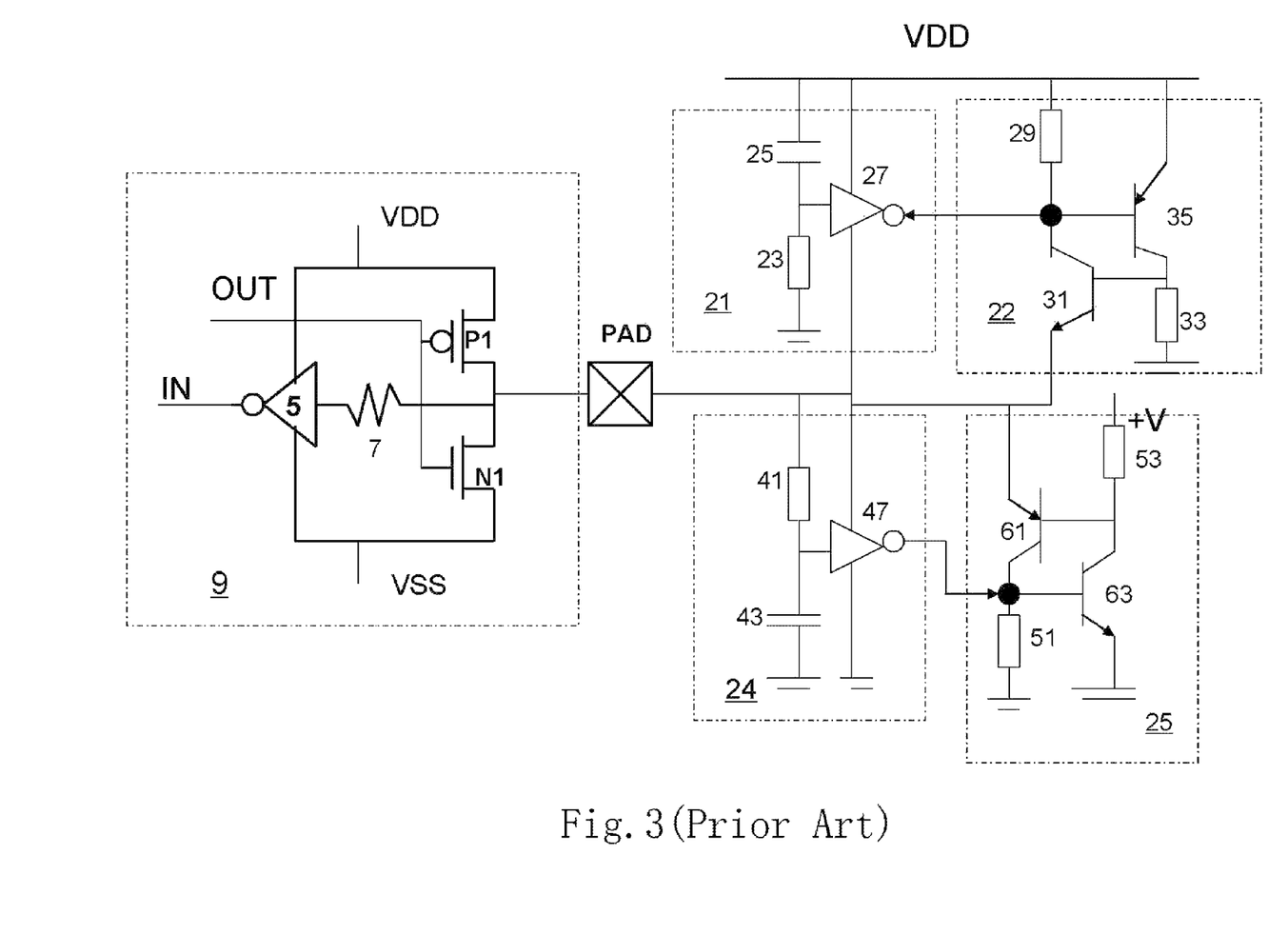
FIG. 3 illustrates in a simplified circuit diagram another ESD circuit of the prior art.

A known arrangement to provide the p-n-p-n structure for an SCR is to couple a pair of bipolar transistors, a p-n-p and an n-p-n, to provide the SCR. FIG. 3 illustrates a prior art ESD circuit using SCR devices. This circuit is described in a paper entitled "Substrate triggered SCR device for on-chip ESD protection in fully silicided sub-0.25-um CMOS process", IEEE Trans. Electron. Devices, vol. 50, no. 2, pp. 397-405, by Ker, et al.

In FIG. 3, input output terminal PAD is coupled again to an input/output buffer circuit 9. Circuit 9 has an inverter 5 providing the input signal to the remainder of an integrated circuit (the remaining circuitry is not shown), an inverter formed of P and N-MOS transistor P1 and N1 coupling the output data to the PAD, and an ESD protection circuit formed of an upper trigger 21, an upper SCR circuit 22, a lower trigger 24, and a lower SCR circuit 25.

SCR circuit 22 is coupled to an upper trigger circuit 21. Capacitor 34 and resistor 23 provide the trigger voltage to inverter 27, which when active, will pull down the base of p-n-p transistor 35, turning it on. Current flowing from the collector of p-n-p transistor 35 will create a positive voltage at the base of n-p-n transistor 31, turning it on and thus SCR circuit 22 will be triggered by the trigger circuit 21 in the event of a positive strike PD. Resistors 29 and 33, which act as bias resistors, are provided by the N-well (resistor 29) and P-well (resistor 33) that the bipolar transistors are formed in, and are not discrete resistor devices. Similarly, the lower trigger circuit 24 which is formed of resistor 41, capacitor 43, and inverter 47, will put a positive voltage on the base of n-p-n transistor 63 and cause current to flow from its emitter and through the resistor 53. Resistor 51 will also have current flowing through it which will, along with the voltage drop from the positive supply to the base of p-n-p transistor 61, cause transistor 61 to turn on and couple the PAD to the VSS through the SCR circuit 25. The lower trigger circuit will turn on when a positive voltage strike PS occurs, allowing the ESD current to flow into VSS.

In an integrated circuit using the ESD protection circuit of FIG. 3, each pad protected requires the two SCR circuits and the two trigger circuits. This requirement increases the silicon area utilized by the ESD circuits. Also, for the SCR circuits to rapidly turn on, the trigger circuits must use larger than normal transistors in the driving inverters, further increasing the silicon area required. Also, due to the configuration of these circuits, it is possible the ESD protection SCR circuits may trigger erroneously during normal switching at the pads of the device.

Prior art variations on these ESD circuits are known. In one variant, the trigger circuits use a so-called "Native NMOS" device to trigger the upper and lower SCR circuits. These native NMOS devices are also required for each pad, and they are turned off by an additional negative bias circuit; this must be done to prevent a large SCR current leakage. This approach does not reduce the silicon area required for the trigger circuitry.

In another prior approach, a chain of diodes is proposed as the trigger circuit. This approach is believed to require even more silicon area, as each pad requires a diode string for each SCR circuit. The diodes have to be large to provide fast SCR turn on during an ESD event. Because of the way the N type wells are biased in this circuit, a potential latch up problem exists. A reverse diode shunt is also required in parallel to the SCR circuits to provide NS (negative from the pad to VSS) and PD (positive from the pad to VDD) protection.

In another prior art approach, the trigger circuit is a NMOS device coupled to a dedicated gate bias circuit. Again, this approach requires a dedicated trigger circuit for each pad, resulting in a larger silicon area. In addition, the NMOS trigger transistor has to be sized larger than normal to provide rapid SCR circuit turn on during an ESD event. High standby current in the SCR circuit and a potential latch up problem again exists with this approach. Also, an extra diode shunt, placed in parallel to the SCR circuit, is needed for NS (negative from the pad to VSS) and PD (positive from the pad to VDD) protection.

A continuing need thus exists for an improved ESD protection circuit and methods that provide robust protection while reducing the amount of silicon area required for the protection circuitry.

BRIEF DESCRIPTION OF THE DRAWINGS

For a more complete understanding of the present application, and the advantages thereof, reference is now made to the following descriptions taken in conjunction with the accompanying drawing, in which.

The drawings, schematics and diagrams are illustrative, not intended to be limiting but are examples of embodiments, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the appended claims.

In one exemplary embodiment, an ESD protection circuit comprises an upper SCR circuit coupled between a protected pad and a positive voltage supply terminal, and having a first trigger input coupled through a well resistor to an RC power clamp coupled between the positive supply terminal and the ground power supply terminal; and a lower SCR circuit coupled between a protected pad and the ground power supply terminal and having a second trigger input coupled through a well resistor to the RC power clamp. In another exemplary embodiment, the upper SCR is triggered by the operation of the RC power clamp. In yet another exemplary embodiment, the lower SCR is triggered by the operation of the RC power clamp. In another exemplary embodiment the upper and lower SCR circuits are triggered by currents injected into the wells by the RC power clamp during ESD events.

In an exemplary method embodiment, ESD protection is provided for a pad terminal of an integrated circuit by providing an upper SCR circuit coupled between the pad and a positive power supply, providing a lower SCR circuit coupled between the pad and a ground power supply, providing an RC power clamp circuit coupled between the positive power supply and the ground power supply, and triggering one of the upper and lower SCR circuits during an ESD event using the RC power clamp.

In an exemplary method embodiment, an SCR protection circuit is provided by forming a first well and a second well in a semiconductor substrate, the first and second wells of opposite conductivity types; forming a first diffusion region in the first well of the first conductivity type and electrically coupled to a ground power supply; forming a first pad contact region of the second conductivity type in the first well proximate to and electrically isolated from the first diffusion region and electrically coupled to a pad terminal; forming a third diffusion region of the second conductivity type in the first well proximate to the first pad contact region and electrically isolated from the pad contact region, and electrically coupled to the ground power supply; forming a third diffusion region of the first conductivity type in the second well proximate to and electrically isolated from the second diffusion region; forming a second contact pad of the first conductivity type in the second well proximate to and electrically isolated from the third diffusion region, and electrically coupled to the pad terminal; forming a fourth diffusion region of the second conductivity type proximate to and electrically isolated from the second pad contact region and electrically coupled to the positive power supply; and providing an RC power clamp circuit coupled between the positive power supply and the ground power supply.

Figure 4:
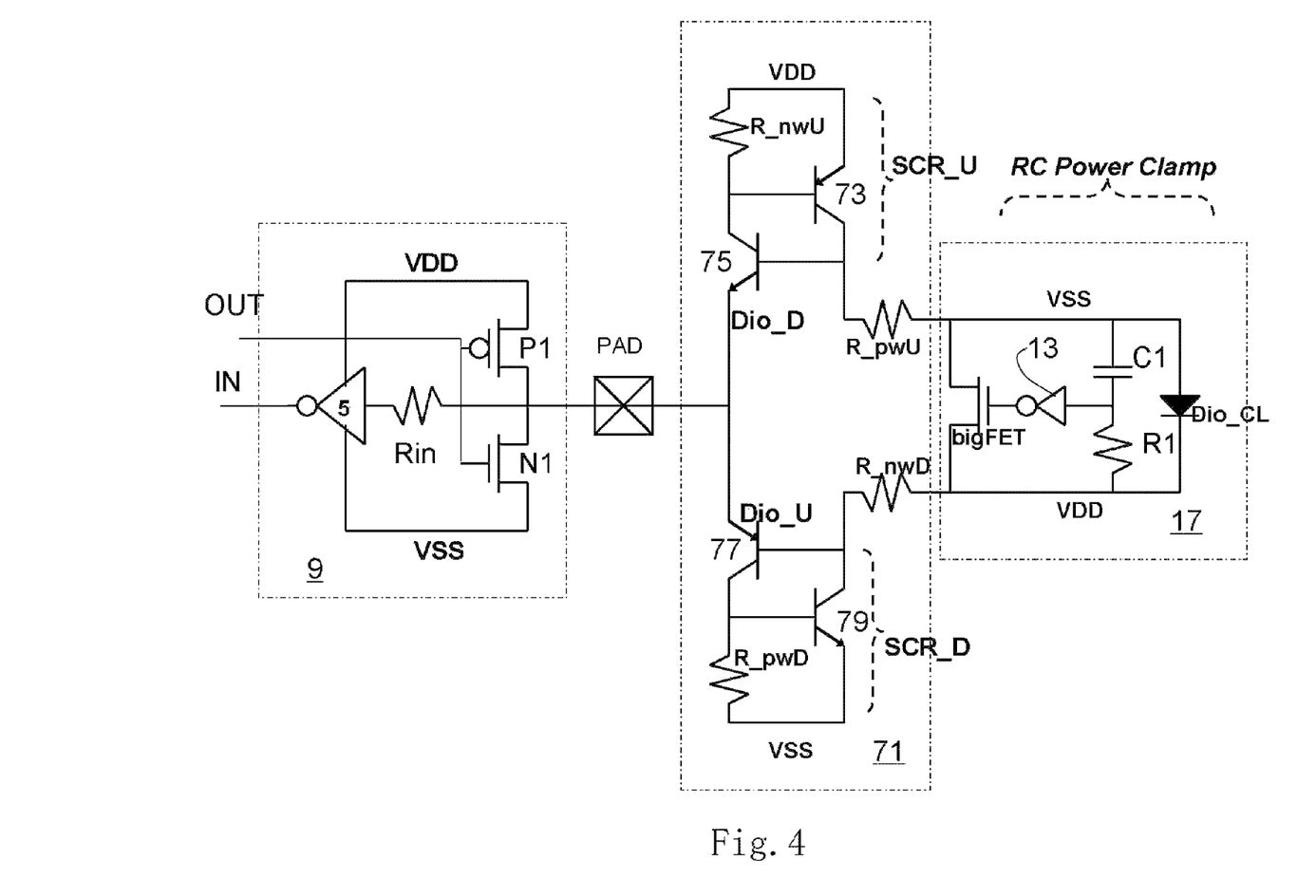
FIG. 4 illustrates in a simplified circuit diagram an exemplary embodiment ESD circuit of the present application.

In an exemplary structure embodiment, an ESD protection structure for an integrated circuit is described comprising a first well and a second well of opposite conductivity types formed in a semiconductor substrate, the wells formed adjacent and having a boundary that is a p-n junction; a first diffused region of the first conductivity type disposed at the surface of the first well and coupled to a ground power supply terminal; a first pad contact region of a second conductivity type disposed at the surface of the first well and adjacent to and electrically isolated from the first diffusion region; a second diffusion region of the second conductivity type disposed at the surface of the first well and electrically isolated from and proximate to the first pad contact region, and coupled to the ground power supply; a third diffused region of the first conductivity type disposed at the surface of the second well proximate to and electrically isolated from the second diffused region; a second pad contact region of the first conductivity type disposed in the second well proximate to and electrically isolated from the third diffused region, and electrically coupled to the pad terminal; a fourth diffused region of the second conductivity type disposed at the surface of the second well proximate to and electrically isolated from the second pad contact region and electrically coupled to the positive power supply; and an RC power clamp circuit coupled between the positive power supply and the ground power supply. FIG. 4 depicts in a circuit diagram an illustrative exemplary embodiment of an ESD circuit. In FIG. 4, a victim circuit, here for a non-limiting example an input output buffer 9 is again coupled to the terminal labeled PAD as before. RC power clamp circuit 17 is again provided to protect from strikes between VSS and VDD, and vice versa and has an inverter 13 and RC circuit R1 and C1 providing the input to the inverter to turn on the FET device bigFET to provide a current path between these terminals during an ESD event; similarly diode Dio_CL provides a current path from VSS to VDD for a negative ESD strike between these terminals.

An ESD protection circuit 71 is also shown in FIG. 4. From PAD to VSS, p-n-p bipolar junction transistor ("BJT") 77 is coupled to n-p-n BJT 79 to form an SCR device labeled SCR_D. The p-n junction from the emitter to the base of p-n-p BJT 77 also provides a diode labeled Dio_U. The resistance in a P-well for the n-p-n BJT 79 provides the bias resistor R_pwD for the base of BJT 79. P-n-p BJT 77 is coupled to complete the SCR_D. The N-well resistance labeled R_nwD between the power clamp VDD and the base of BJT 77 provides the bias to the base of that transistor. The p type emitter of transistor 77 couples SCR_D to the pad terminal PAD and provides a p-n diode between the PAD and VDD through the well resistor R_nwD.

A second SCR provides the upper ESD protection circuit, labeled SCR_U. This SCR is formed of the N-well resistance R_nwU from VDD to the base of p-n-p BJT 73, n-p-n BJT 75 and the P-well resistance R_pwU from the base of BJT 75 to voltage VSS. The p-n base-emitter junction of BJT 75 also forms a diode labeled Dio_D that is forward biased from VSS to the PAD terminal.

In FIG. 4, the ESD protection circuit 71 will be placed at each protected input, output or input/output pad for the integrated circuit. There may be dozens, or hundreds, of such pads. Importantly, the power clamp circuit 17 is only placed in the integrated circuit once, or a few times at most. As an advantage of this embodiment, there is no trigger circuit required for each SCR and for each pad; instead injection current into the wells is used with the RC power clamp circuit to forward bias a transistor during an ESD event, and trigger the SCR to protect the victim circuit. The silicon area saved using the circuit of FIG. 4, which requires no separate trigger circuit, is significant as compared to the prior art solutions.

Figure 5:
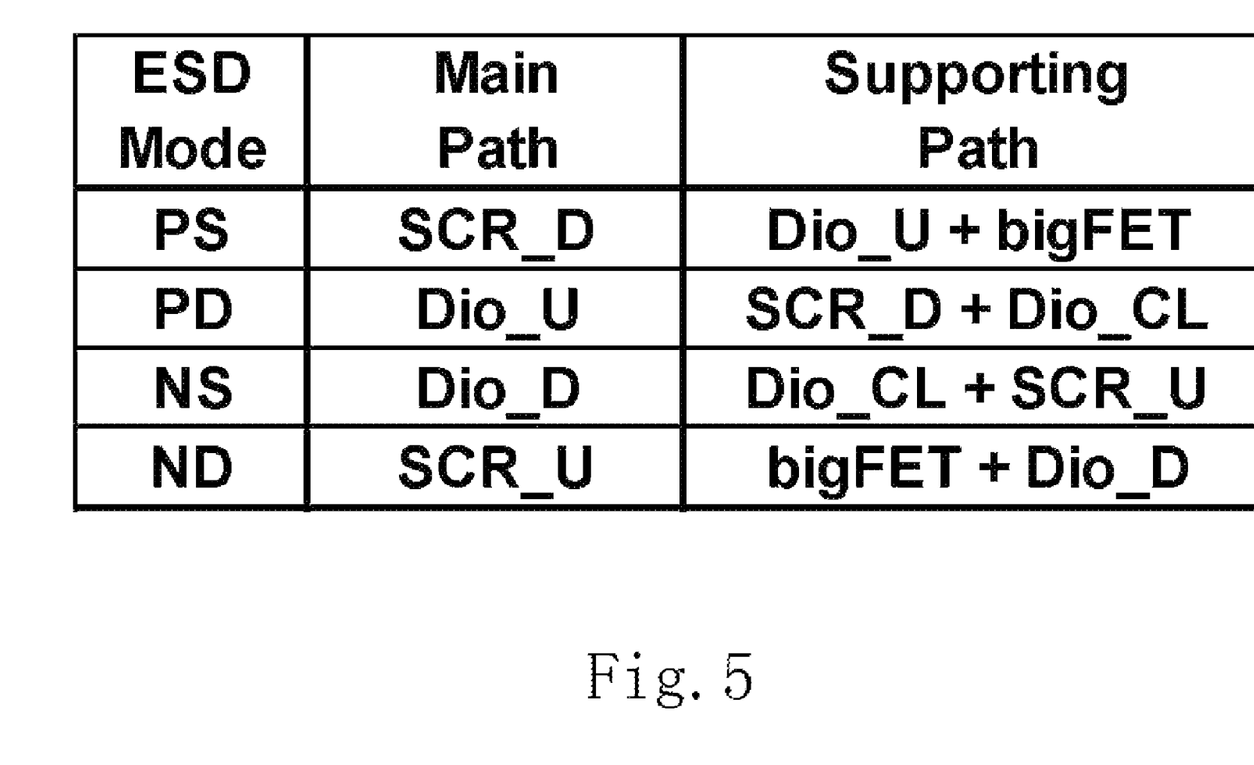
FIG. 5 illustrates a table of operations of the ESD circuit of FIG. 4.

FIG. 5 depicts, for each of the four modes of ESD strike described above, a table illustrating the primary and supporting current flow paths for the ESD protection circuit of FIG. 4. From the table of FIG. 5, it can be seen that for an ESD mode PS event, a positive voltage from the PAD terminal to the VSS terminal, the main path is SCR_D. This means that the SCR_D, formed from BJTs 77 and 79 and the well resistors R_pwD and R_nwD as shown in FIG. 4 is triggered and conducts current away from the victim circuit. In the embodiment of FIG. 4, the triggering is done not by a trigger circuit, but instead by means of injection current flowing into wells. In this example, the PS event puts a positive voltage on the PAD with respect to VSS. The voltage at the pad will forward bias the p-n junction of the emitter of BJT 77 with respect to the base of BJT 77 and inject current into the N-well. In a PS ESD event, positive ESD current will inject into emitter/base junction of BJT 77 (Dio_U which now is forward biased). The VDD bus is then charged up and the RC power clamp is triggered on to provide a low resistance path to VSS to sustain the emitter/base current of BJT 77. As the ESD (emitter) current increases, significant hole current will flow into the collector (P-well) of BJT 77, which is also the base of BJT 79, then on to Vss through the resistor R_pwD. When the voltage drop of R_pwD exceeds the base/emitter voltage of BJT 79, BJT 79 will turn on. BJT 79 is then coupled with BJT 77 to form a low resistance p-n p-n device (SCR_D). This SCR device provides a direct current discharge path of positive ESD current from the pad to Vss.

The table of FIG. 5 further describes that the supporting paths of Dio_U and the transistor bigFET in the RC power clamp conduct current during the PS ESD mode event. This improves the effectiveness of the ESD protection by providing additional conductive paths away from the victim circuit coupled to the terminal PAD.

In FIG. 5, the next mode depicted is a PD event. In PD mode, a positive voltage from the pad to the VDD supply, the main path for current is the diode Dio_U. Referring to the circuit diagram of FIG. 4, in this mode the p-n junction of diode Dio_U is forward biased and there is a path from the base of BJT 77 through the N-well to voltage VDD, thus a direct path is provided. In addition, SCR_D and the clamp diode Dio_CL provide supporting paths for current to flow. The supporting path looks straightforward. As the pad to VDD current flow increases, the base voltage of BJT 77 goes up and significant hole current flows into the collector of BJT 77 and turns on the SCR_D. A portion of ESD current will then flow from the pad to Vss through SCR_D, then to VDD through diode Dio_CL.

ESD events in mode NS, where there is a negative voltage on the PAD with respect to terminal VSS, are also described in the table. In this mode, the p-n junction of the base emitter of BJT 75 in FIG. 4, labeled Dio_D, is forward biased and provides a path back to VSS through a P-well to the RC clamp circuit. The supporting paths of Dio_CL and SCR_U provide additional current paths to protect the victim circuit from the ESD current.

The bottom row of the table of FIG. 5 depicts the paths for an ESD event in ND mode, or a negative voltage at the terminal PAD with respect to the positive voltage supply VDD. In this event, the upper SCR circuit SCR_U in FIG. 4 is triggered by current injection into the P-well the n-p-n transistor is formed in, and there is a path through Dio_D and the bigFET transistors that provides supporting paths for the ND event. The protection for ND mode is very similar to that of PS mode. In a ND mode event, negative current is injected to emitter/base of BJT 75. Negative voltage is developed at Vss. The RC power clamp is triggered on to sustain the current. As the negative current increases, significant electron current flows into the collector (N-well) of BJT 75, which is also the base of BJT 73, then on to VDD through resistor R_nwU. When the voltage drop of R_nwU exceeds the base/emitter voltage of BJT 73, BJT 73 will turn on. BJT 73 is coupled with BJT 75 to form a low resistance p-n device (SCR_U). This SCR device provides a direct discharge current path of negative ESD current from pad to Vss.

Figure 6:
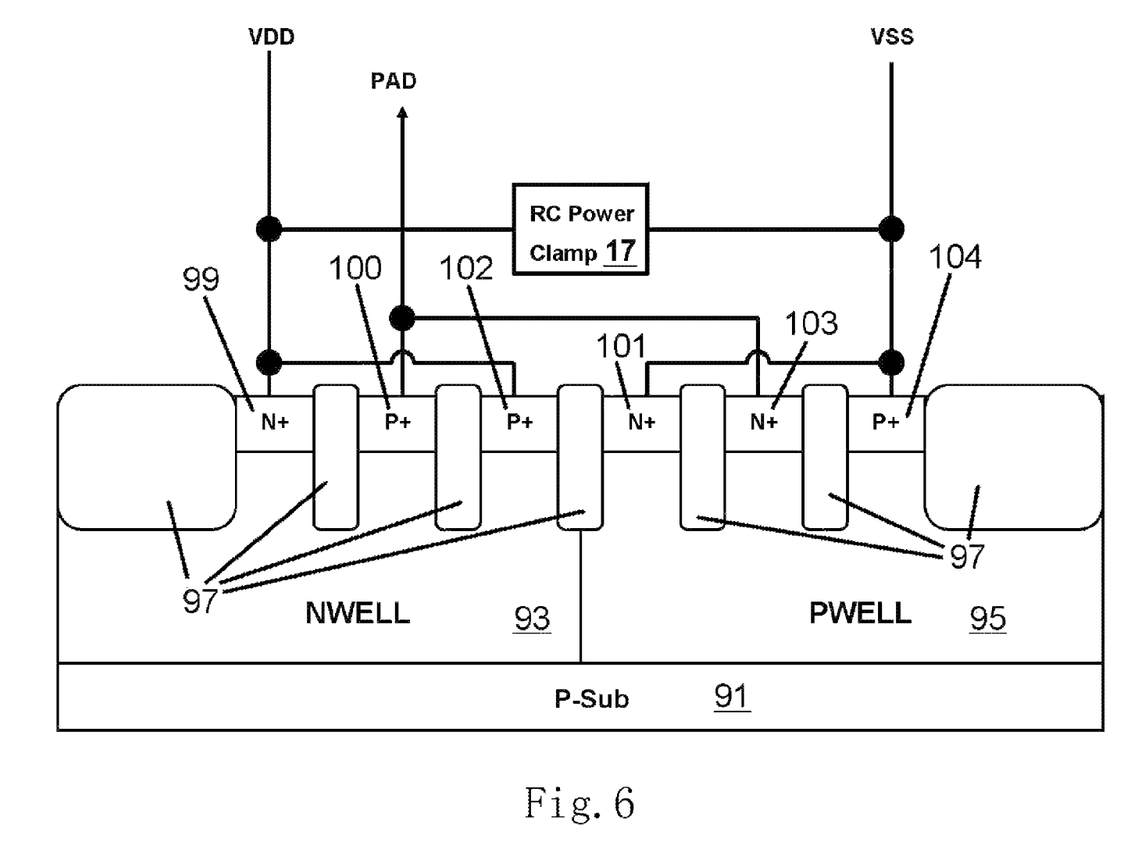
FIG. 6 illustrates an exemplary structural embodiment of an ESD circuit.

FIG. 6 illustrates in a cross sectional view an exemplary structure embodiment for forming the SCR devices of protection circuit 71 in FIG. 4. By taking advantage of certain features, the structure of FIG. 6 combines certain elements of the SCR_U and SCR_D circuits and therefore forms a more compact structure than would otherwise be the case, resulting in further area savings in the silicon integrated circuits that use the embodiments of the present application. In FIG. 6, RC power clamp 17 is shown coupled between the ground and negative power supply VSS and the positive supply VDD. A semiconductor substrate 91, which may be for one non-limiting example a P-type semiconductor substrate, is provided. Using any of several known semiconductor fabrication techniques, N-well 93 and P-well 95 are formed. These may be doped regions, or the N region may be doped and the P-well may be undoped P semiconductor substrate material, or the wells may be epitaxially grown. Thermal diffusion and/or ion implantation may be used to form the wells as is known in the art. SOI techniques may also form N and P-wells as shown.

Isolation regions 97 are formed. These may be, for example, shallow trench isolation (STI) or other types of isolation regions such as LOCOS. N+ regions 99, 101, and 103 are formed. P+ regions 100, 102 and 104 are formed using conventional patterning and ion implantation steps. Conductive paths such as polysilicon, aluminum, copper, alloys of aluminum and copper, and the like are formed using conventional semiconductor processing techniques to couple the positive supply terminal VDD and ground or negative supply terminal VSS and the PAD terminal, as shown. The power supply terminals are further coupled to at least one RC power clamp circuit 17, which is arranged as shown in the earlier figures. Note that the structure of FIG. 6 is present at each protected pad, while the RC power clamp 17 is not repeated for every pad, only one, or a few of these protection circuits are needed for an integrated circuit.

FIG. 6 represents in a simplified view the structure for one possible implementation of the ESD protection circuit 71 of FIG. 4. By referencing the connections of FIG. 4, the roles of the N-well 93, P-well 95, and the diffused contact regions 99, 101, 103 (of type N+) and the regions 100, 102 and 104 (of type P+) can be better understood. For example, the pad terminal PAD in FIG. 4 is coupled to the emitter of n-p-n BJT 75. In FIG. 6 this corresponds to N+ region 103, in P-well 95. The terminal PAD is further coupled to the emitter of p-n-p BJT 77, in FIG. 6 this corresponds to P+ region 100 in N-well 93. Similarly, the connections to the power supplies VDD and VSS may be determined from FIG. 4 and the correspondences understood.

The structure of FIG. 6 is but one possible implementation and is considered to be a "combo" layout, that is, certain SCR elements are shared and the implementation takes advantage of the P-N junction from P-well 95 and N-well 93. In a different semiconductor process, a different structural implementation could be used to form the circuit of FIG. 4 and so this exemplary embodiment layout is one advantageous implementation of the circuit of FIG. 4. Other alternative layout embodiments are contemplated and within the scope of the appended claims.

Figure 7:
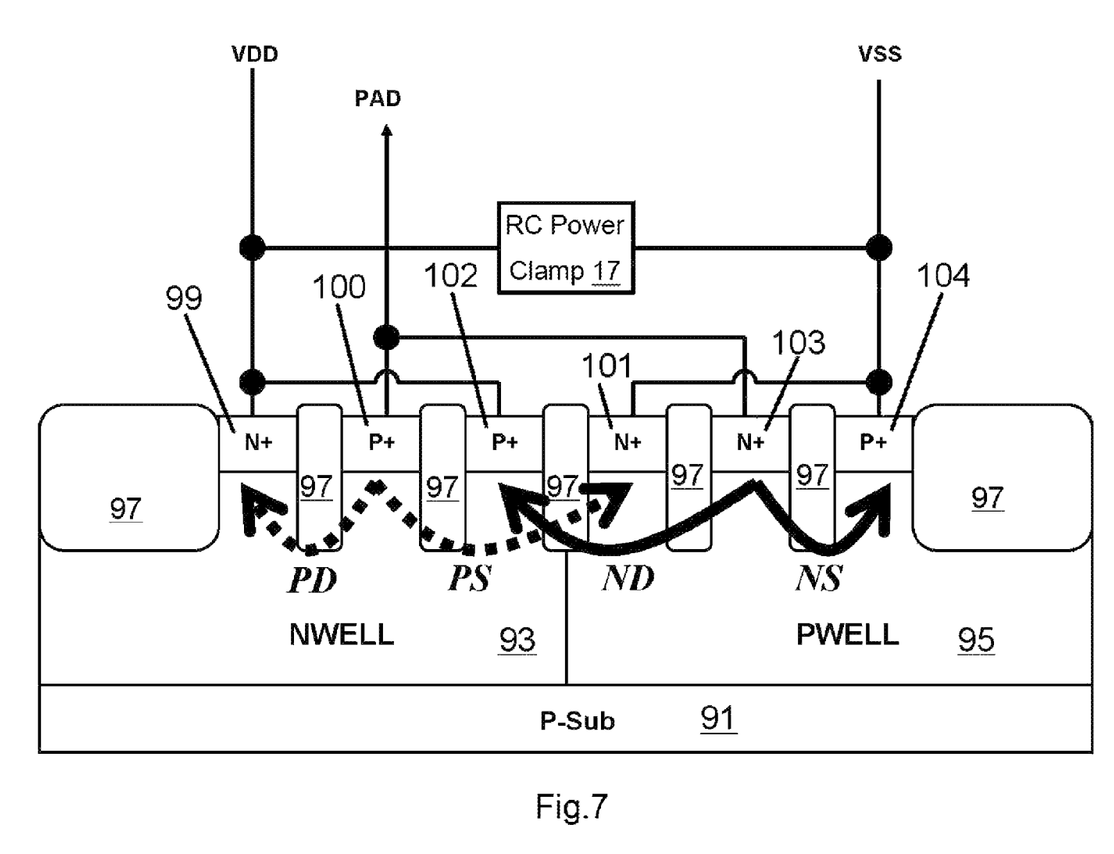
FIG. 7 illustrates ESD paths used in the operation of the embodiment of FIG. 6.

The operation of the ESD protection circuitry as implemented in FIG. 6 can be better understood with reference to FIG. 7, which illustrates the primary paths for each of the four modes of ESD event from the PAD terminal to either VSS or VDD. For a positive strike with respect VSS, in FIG. 7 the path labeled "PS" in a dashed line depicts the path from the P+ terminal 100, to the N-well 93, into the P-well 95, and to the N+ diffusion 101 which is coupled to VSS. In the table of FIG. 5, the primary path for this ESD mode was shown as SCR_D. Referring to the circuit diagram of FIG. 4, SCR_D is the emitter of p-n-p 77, the n type collector and n base junction of transistors 77 and 79, the p type junction of the collector of transistor 77 and the base of transistor 79, and the P-well resistor R_pwD couples the path to VSS, which is also the emitter (n type) of transistor 79. Put another way, the SCR_D should be a p-n-p-n path, and in FIG. 7 this corresponds to P+ 100, N-well 93, P-well 95 and N+ region 101.

The primary path for a positive strike from the terminal PAD to the VDD terminal is labeled PD in FIG. 7. The table in FIG. 5 indicates that for this ESD mode the primary path should be a diode Dio_U. In FIG. 4, this is shown as the p type emitter terminal of transistor 77 and the base terminal (n type) of transistor 77 further couples through a well resistor R_nwD to voltage VDD. Referring again to FIG. 7, this path is shown as a dashed line labeled "PD" from P+ region 100, through N-well 93, and into the N+ region 99 to VDD. Thus the PN diode Dio_U is provided by the P+N-well junction of region 100 and N-well 93.

Similarly, for the NS mode, the primary path for a negative strike from the PAD terminal to VSS is shown in the table of FIG. 5 as being a diode Dio_D. In FIG. 7 this path is shown by a solid line labeled NS, so in FIG. 7 diode Dio_D corresponds to the N+ region 103 and the P-well 95, which is coupled to VSS by P+ region 104. Referring to FIG. 4, the n type emitter of n-p-n transistor 75 and the p type base form the diode Dio_D, so these regions correspond to that part of the ESD circuit 71.

Finally, the primary path for a negative strike from the terminal PAD to the VSS terminal is shown in FIG. 7 as a solid line labeled "ND". The table in FIG. 5 shows this path as the SCR labeled SCR_U. In the circuit diagram of FIG. 4, this SCR path is from PAD to the emitter of n-p-n transistor 75, though the base terminal and collector terminal junction of transistors 75 and p-n-p transistor 73, into the base (n type) of transistor 73 and the junction with the collector of transistor 75, through a well resistance R_nwU to terminal VDD, which is also coupled to the emitter of transistor 73.

In FIG. 7 the corresponding path through the SCR structure can be seen, from N+ region 103, to the P-well region 95, into the N-well 93, and then to the P+ region 102 to terminal VDD. The SCR_U is then an n-p-n-p conductive path.

In a completed integrated circuit embodiment, the ESD circuit of FIG. 4 and the combo layout structure of FIG. 7 would be present at each protected input, output or input/output pad in a device incorporating these embodiments. The layout of FIG. 7 is one advantageous structure for implementing the ESD protection circuit of FIG. 4, of course other layout structures can also be used and these will still obtain the advantages of the ESD circuit embodiment, which are without limitation that the ESD circuit embodiment provides a direct and supporting path for each of the four modes of ESD strike, no trigger circuits are required as triggering is performed by injection of currents into the wells and by the existing RC clamp circuitry, which is not repeated at each pad, and substantial silicon area savings are achieved.

Further, the embodiments and alternative embodiments within the scope of the appended claims provide an ESD protection circuit with high latch up immunity during normal operation as the wells (93 and 95 in FIGS. 6 and 7) are coupled to a solid power and ground supply terminal connection, and are not left floating as in some of the prior art structures.

Further silicon area savings may be achieved by combining portions of the SCR_U and SCR_D structures in the ESD circuit embodiment when implementing the layout, as shown in FIGS. 6 and 7.

This simple ESD protection circuit is particularly appropriate for low voltage circuits in input/output pad applications. For example, low noise amplifiers (LNA) with low capacitance RF characteristics running at frequencies in excess of 5 Gigahertz. Low voltage drivers for communications buses in the higher data bandwidth ranges, such as Gigabit per second (Gbps) services on serial/deserial (Ser/Des) buses like PCI Express, SATA, and the like. These integrated circuits also benefit from the use of the embodiments and alternative embodiments contemplated herein and within the scope of the appended claims, many other applications would also benefit. Generally the embodiments may be used to provide ESD protection in integrated circuits and significant advantages in reliability and silicon area will be achieved.

Although embodiments of the present application and their advantages have been described in detail, it should be understood that various changes, substitutions and alterations can be made herein without departing from the spirit and scope of the disclosure as defined by the appended claims. For example, it will be readily understood by those skilled in the art that the methods may be varied while remaining within the scope of the embodiments disclosed and the application.

Moreover, the scope of the present application is not intended to be limited to the particular embodiments of the methods and steps described in the specification. As one of ordinary skill in the art will readily appreciate from the disclosure, processes, or steps, presently existing or later to be developed, that perform substantially the same function or achieve substantially the same result as the corresponding embodiments described herein may be utilized according to the disclosures herein. Accordingly, the appended claims are intended to include within their scope such processes or steps.

What is claimed is:

1. An ESD protection circuit, comprising:
a pad of an integrated circuit;
circuitry coupled to the pad for buffering data;
an RC power clamp on the integrated circuit and coupled between a positive power supply terminal and a negative power supply terminal;
an upper SCR circuit coupled between the pad and the positive power supply terminal, and having a first trigger input coupled to the RC power clamp circuit, the upper SCR circuit having resistors formed in first and second wells; and a lower SCR circuit coupled between the pad and the negative power supply, and having a second trigger input coupled to the RC power clamp circuit, the lower SCR circuit having resistors formed in third and fourth wells;

wherein the RC power clamp is operable during an ESD event to inject current into a well that forms a portion of a vertical BJT in a respective one of the upper and lower SCR circuits.

2. The ESD protection circuit of claim 1, wherein the upper SCR circuit further comprises:
  a first bipolar transistor having an emitter coupled to the pad, a base coupled through a first well resistor to form the first trigger input further coupled to the negative supply terminal of the RC power clamp, a collector coupled through a second well resistor to the positive power supply terminal; and
  a second bipolar transistor having an emitter coupled to the positive power supply terminal, a base coupled to the collector of the first bipolar transistor, and a collector coupled to the base of the first bipolar transistor and to the first trigger input;
wherein the first and second wells are of opposite conductivity types.

3. The ESD protection circuit of claim 1, wherein the lower SCR circuit further comprises:
  a third bipolar transistor having an emitter coupled to the pad, having a base coupled to the second trigger input which is further coupled through a third well resistor to the positive power supply terminal of the RC power clamp, and having a collector coupled through a fourth well resistor to the negative power supply terminal; and
  a fourth bipolar transistor having a collector coupled to the base of the third bipolar transistor and to the trigger input, a base coupled to the collector of the third bipolar transistor and an emitter coupled to the negative power supply terminal;
  wherein the third and fourth wells are of opposite conductivity types.

4. The ESD protection circuit of claim 1, wherein the first and fourth wells are of the same conductivity type and the second and third wells are of the same conductivity type.

5. The ESD protection circuit of claim 4, wherein the first and fourth wells are of a p conductivity type and the second and third wells are of an n conductivity type.

6. The ESD protection circuit of claim 1, wherein the current injected is sufficient to trigger the respective one of the upper and lower SCR circuits.

7. An integrated circuit, comprising:
a single RC power clamp circuit disposed between a positive power supply terminal and a negative power supply terminal;
  a plurality of pads, each pad having a respective ESD protection circuit further comprising:
    an upper SCR circuit coupled between the pad and the positive power supply terminal, and having a first trigger input coupled to the RC power clamp circuit, the upper SCR circuit having resistors formed in first and second wells; and
    a lower SCR circuit coupled between the pad and the negative power supply terminal, and having a second trigger input coupled to the RC power clamp circuit, the lower SCR circuit having resistors formed in third and fourth wells;
  wherein the single RC power clamp circuit is coupled to inject current into at least one of the first, second third and fourth wells that forms a portion of the upper and lower SCR circuits of the ESD protection circuits.

8. The integrated circuit of claim 7, wherein the upper SCR circuit of each of the ESD protection circuits further comprises:
  a first bipolar transistor having an emitter coupled to the pad, a base coupled through a first well resistor to form the first trigger input further coupled to the negative power supply terminal of the RC power clamp, a collector coupled through a second well resistor to the positive power supply terminal; and
  a second bipolar transistor having an emitter coupled to the positive power supply terminal, a base coupled to the collector of the first bipolar transistor, and a collector coupled to the base of the first bipolar transistor and to the first trigger input;
  wherein the first and second wells are of opposite conductivity types.

9. The integrated circuit of claim 8, wherein the lower SCR circuit of each of the ESD protection circuits further comprises:
  a third bipolar transistor having an emitter coupled to the pad, having a base coupled to the second trigger input which is further coupled through a third well resistor to the positive power supply terminal of the RC power clamp, and having a collector coupled through a fourth well resistor to the negative power supply terminal; and
  a fourth bipolar transistor having a collector coupled to the base of the third bipolar transistor and to the trigger input, a base coupled to the collector of the third bipolar transistor and an emitter coupled to the negative power supply terminal;
  wherein the third and fourth wells are of opposite conductivity types.

10. The integrated circuit of claim 9, wherein the first and fourth wells are of the same conductivity type and the second and third wells are of the same conductivity type.

11. The integrated circuit of claim 9, wherein the first and fourth wells are of a p conductivity type and the second and third wells are of an n conductivity type.

12. The integrated circuit of claim 9, wherein the single RC power clamp is coupled to inject current into at least one of the first, second, third and fourth wells that forms a portion of a vertical BJT in a respective one of the upper and lower SCR circuits of the ESD protection circuits.

13. The integrated circuit of claim 12, wherein the current injected is sufficient to trigger a respective one of the upper and lower SCR circuits.

14. An integrated circuit, comprising:
  at least one RC power clamp circuit disposed between a positive power supply terminal and a negative power supply tee urinal;
  a plurality of signal pads, each having an ESD protection circuit, each of the ESD protection circuits further comprising:
    an upper SCR circuit coupled between the pad and the positive power supply terminal, and having a first trigger input coupled to the RC power clamp circuit, the upper SCR circuit having resistors formed in first and second wells; and
    a lower SCR circuit coupled between the pad and the negative power supply terminal, and having a second trigger input coupled to the RC power clamp circuit, the lower SCR circuit having resistors formed in the first and second wells;
  the at least one of the RC power clamp circuit coupled to inject current into at least one of the first and second wells that forms a portion of the upper and lower SCR circuits of the ESD protection circuits.

15. The integrated circuit of claim 14, wherein the upper SCR circuit of each of the ESD protection circuits further comprises:
- a first bipolar transistor having an emitter coupled to the pad, a base coupled through a first well resistor to form the first trigger input further coupled to the negative power supply terminal of the RC power clamp, a collector coupled through a second well resistor to the positive supply terminal; and
- a second bipolar transistor having an emitter coupled to the positive power supply terminal, a base coupled to the collector of the first bipolar transistor, and a collector coupled to the base of the first bipolar transistor and to the first trigger input;
- wherein the first and second wells are of opposite conductivity types.

16. The integrated circuit of claim 15, wherein the wherein the lower SCR circuit of each of the ESD protection circuits further comprises:
- a third bipolar transistor having an emitter coupled to the pad, having a base coupled to the second trigger input which is further coupled through a third well resistor to the positive power supply terminal of the RC power clamp, and having a collector coupled through a fourth well resistor to the negative power supply terminal; and
- a fourth bipolar transistor having a collector coupled to the base of the third bipolar transistor and to the trigger input, a base coupled to the collector of the third bipolar transistor and an emitter coupled to the negative power supply terminal;
- wherein the third well resistor is disposed in the first well, and the fourth well resistor is disposed in the second well.

17. The integrated circuit of claim 14, wherein the current injected by the at least one RC power clamp circuit is sufficient to trigger a respective one of the upper and lower SCR circuits.

18. The integrated circuit of claim 14, wherein the at least one RC power clamp circuit comprises two RC power clamp circuits on the integrated circuit.

19. The integrated circuit of claim 14, wherein the at least one power clamp circuit comprises not more than one RC power clamp circuit on the integrated circuit.

* * * * *

UNITED STATES PATENT AND TRADEMARK OFFICE
CERTIFICATE OF CORRECTION

PATENT NO. : 8,405,943 B2  
APPLICATION NO. : 13/282179  
DATED : March 26, 2013  
INVENTOR(S) : Song et al.

Page 1 of 1

It is certified that error appears in the above-identified patent and that said Letters Patent is hereby corrected as shown below:

In the Claims

In Col. 12, line 50, claim 14, delete "tee urinal" and insert --terminal--.

Signed and Sealed this
Eighteenth Day of June, 2013

Teresa Stanek Rea
*Acting Director of the United States Patent and Trademark Office*